(12) United States Patent
Sander et al.

(10) Patent No.: US 9,479,163 B2
(45) Date of Patent: Oct. 25, 2016

(54) CIRCUITRY AND METHOD FOR OPERATING AN ELECTRONIC SWITCH

(71) Applicant: Infineon Technologies AG, Neubiberg (DE)

(72) Inventors: Rainald Sander, Munich (DE); Veli Kartal, Munich (DE); Alfons Graf, Kaufering (DE)

(73) Assignee: Infineon Technologies AG, Neubiberg (DE)

( * ) Notice: Subject to any disclaimer, the term of this patent is extended or adjusted under 35 U.S.C. 154(b) by 508 days.

(21) Appl. No.: 13/954,921

(22) Filed: Jul. 30, 2013

(65) Prior Publication Data
US 2015/0035385 A1    Feb. 5, 2015

(51) Int. Cl.
| | |
|---|---|
| *H01H 1/00* | (2006.01) |
| *H03K 17/94* | (2006.01) |
| *H03K 17/042* | (2006.01) |
| *H03K 17/082* | (2006.01) |

(52) U.S. Cl.
CPC ............... *H03K 17/94* (2013.01); *H01H 1/00* (2013.01); *H03K 17/04206* (2013.01); *H03K 17/0822* (2013.01); *H03K 2217/0027* (2013.01); *H03K 2217/0036* (2013.01); *Y10T 307/766* (2015.04); *Y10T 307/826* (2015.04)

(58) Field of Classification Search
CPC .......................................................... H01H 1/00
USPC ................................................. 307/125, 130
See application file for complete search history.

(56) References Cited

U.S. PATENT DOCUMENTS

| | | | |
|---|---|---|---|
| 6,903,595 B2* | 6/2005 | Won ..................... | H03K 17/063 327/403 |
| 2015/0155856 A1* | 6/2015 | Lu-Ruhbach ........ | H03K 17/122 327/143 |

FOREIGN PATENT DOCUMENTS

| | | |
|---|---|---|
| EP | 2107673 A1 | 10/2009 |
| JP | 2003168963 A | 6/2003 |

* cited by examiner

*Primary Examiner* — Adi Amrany
(74) *Attorney, Agent, or Firm* — Slater Matsil, LLP (57) ABSTRACT

A circuit includes an electronic switch with an isolated gate, a measuring device for determining a charge at the isolated gate, and an energy supply for providing charge to the isolated gate based on the charge determined by the measuring device.

29 Claims, 7 Drawing Sheets

CIRCUITRY AND METHOD FOR OPERATING AN ELECTRONIC SWITCH

BACKGROUND OF THE INVENTION

Embodiments relate to current-optimized control for an electronic switch.

SUMMARY

A first embodiment relates to a circuit comprising an electronic switch with an isolated gate; a measuring device for determining a charge at the isolated gate; and an energy supply for providing charge to the isolated gate based on the charge determined by the measuring device.

A second embodiment relates to a vehicle comprising at least one circuitry as described herein.

A third embodiment relates to a method for controlling an electronic switch with an isolated gate, comprising the steps: determining a charge at the isolated gate; and providing charge to the isolated gate based on the charge determined.

A forth embodiment is directed to an electronic switching circuitry comprising means for determining a charge at the isolated gate; and means for providing charge to the isolated gate based on the charge determined.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

Examples presented herein refer to power switches that may be used to replace passive fuses or relays in devices, e.g., in the automotive field, in particular in vehicles such as cars. Hereinafter, the term electronic switch may be used for any sort of electronic switching functionality in various use case scenarios. The electronic switch may comprise at least one of the following: a transistor, a PMOS, an NMOS, a FET, a JFET, an IGBT, etc. The electronic switch may have an isolated gate which may serve as a control input. The device described herein may be any device that can be subject to a low power or standby mode. The device may in particular be a car, a control unit of a car. Car or vehicle referred to hereinafter are examples for such devices. The solution presented, however, is not limited to such devices.

As several functions of the device are required to remain active during a standby state (e.g., a parking state of a car) of the device, the electronic switch is required to remain conductive and at the same time consume only as little current (power) as possible. This state when the switch is activated, i.e. in a conductive state and should consume only a small amount of power is also referred to as IDLE state.

This IDLE state allows the electronic switch being use as a traditional fuse, which does not consume any (relevant) power when the device is in the standby state. In addition to the common fuse, the electronic switch may provide additional functionalities, e.g., to measure a current and to switch off a current based on predetermined trigger, e.g., even without the occurrence of a short-circuit.

When in the IDLE state, the electronic switch may be in a low power node consuming, e.g., several microamperes.

When the device (e.g., car) is in an active mode (being driven around), the electronic switch is also in a conductive mode, referred to as ON state, wherein a current load across the electronic switch may be considerably higher compared to the IDLE state. Comparing the IDLE state and the ON state reveals that the current across the electronic switch may vary by several decades. This requires the control for the electronic switch to be flexible.

The ON state of the electronic switch may be used during normal operation of the device, e.g., the vehicle being driven. In this ON state, the current consumption of the electronic switch may amount to several milliamperes.

Furthermore, the electronic switch may enter an non-conductive mode, referred to as OFF state. In addition to states of the electronic switch a functionality is provided that allows reducing the power consumption for the control of the electronic switch.

The IDLE state may be used during the standby mode of the device, e.g., the vehicle being parked. When in IDLE state, the current consumption of the electronic switch may have to be significantly lower compared to the power consumption during the ON state of the electronic switch in order not to prematurely deplete the battery of the device (e.g., car).

In order to enter the IDLE state, the electronic switch may be in the ON state. Then the control of the electronic switch enters a reduced current consumption mode. This order may be beneficial in order to ensure full functionality of the electronic switch, which may require higher control currents than available in the IDLE state.

As an alternative, a different succession of state changes may be used. The electronic switch may directly enter the IDLE state, which may be a result of a staged switching conducted by a controller, e.g., a microcontroller, or it may be a result of a timing provided by the switch itself.

It is also possible to automatically re-enter the ON state from the IDLE state, e.g., due to an overcurrent (i.e. a current larger than a predetermined threshold) and/or due to an overvoltage (i.e. a voltage larger than a predetermined threshold, e.g., a drain-source voltage of the electronic switch). Basically, any (e.g., predetermined) trigger may be used to (automatically) initiate a state change from IDLE to ON. One example is a timer, which indicates that a measurement (e.g., temperature measurement) needs to be conducted by the electronic switch (or an associated unit which may involve the electronic switch). After such measurement, the electronic switch may re-enter the IDLE state. This additional functionality of the electronic switch indicating, e.g., a transient phase of an ON state based on an (external)

trigger can be used for various applications, e.g., monitoring purposes, measurements, etc., which does not have to be based on an underlying state change of the device (e.g., the car entering driving state from its standby state). After the application is concluded, the electronic switch may re-enter the IDLE state from the ON state.

Figure 1:
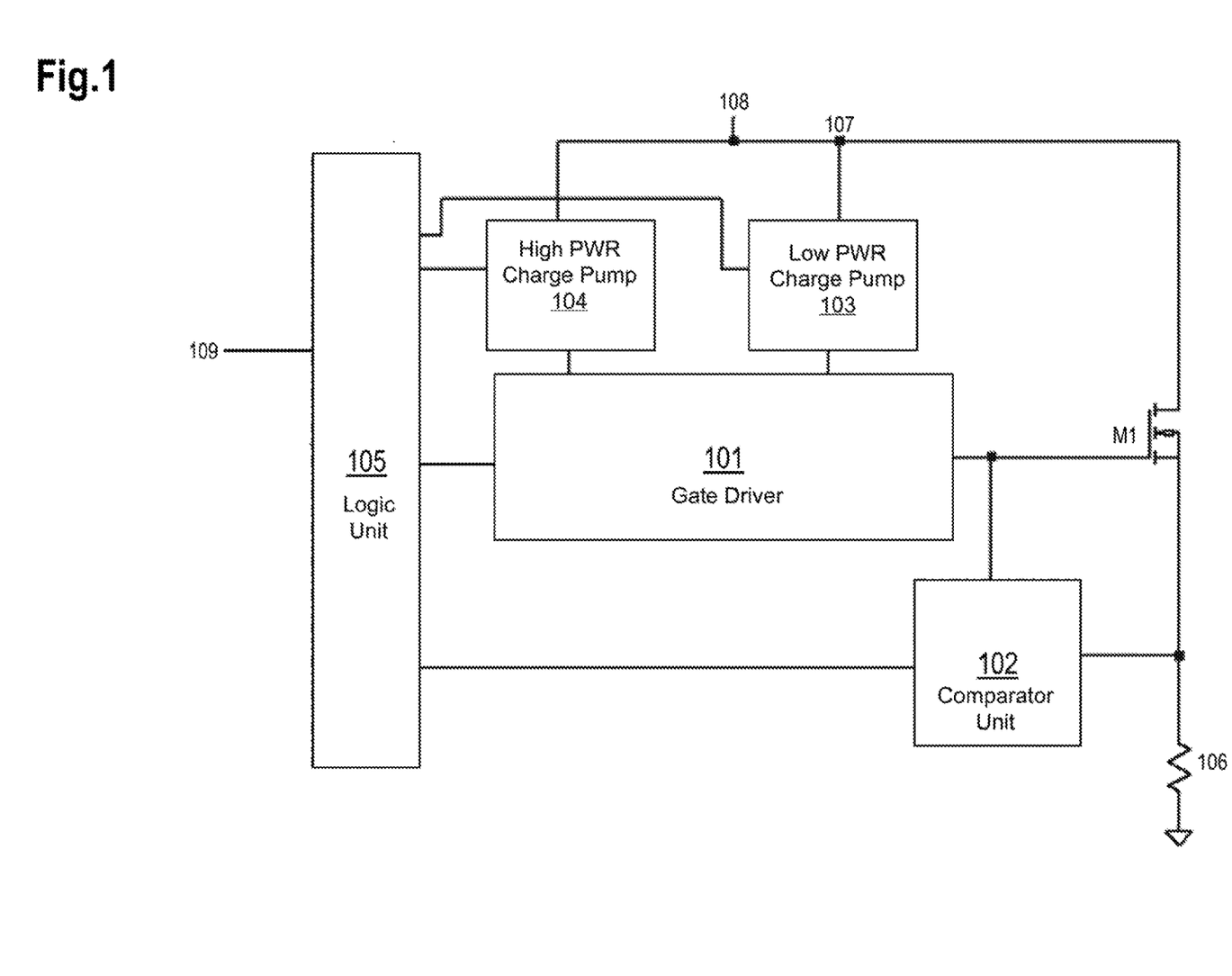
FIG. 1 shows a block diagram visualizing an example of a high side-n-channel configuration.

FIG. 1 shows a block diagram visualizing an example of a high side-n-channel configuration. The gate of an n-channel-MOSFET M1 is driven via a gate driver 101. The source of the MOSFET M1 is connected via a resistor 106 to ground. The drain of the MOSFET M1 is connected to a node 107, which is connected to a supply voltage 108.

A comparator unit 102 compares the gate-source voltage Vgs of the MOSFET M1 and supplies a result of the comparison to a logic unit 105.

The logic unit 105 may be any sort of control device, e.g., a microcontroller, a controller, a processor or the like. The logic unit 105 may control a high power charge pump 104 and a low power charge pump 103 as well as the gate driver 101. The high power charge pump 104 and the low power charge pump 103 are each connected to the supply voltage 108 and provide power to the driver 101 depending on the control applied by the logic unit 105.

The logic unit 105 is controlled via a single input pin 109. As an option, several input pins can be provided (not shown in FIG. 1) to supply external signals to the control unit 105.

Hence, the comparator unit 102 monitors the voltage drop Vgs between gate and source of the MOSFET M1, which corresponds to the state of the electronic switch MOSFET M1 and indicates whether the gate-source voltage Vgs suffices to guarantee the maximum admissible on-state resistance. The low power charge pump 103 is used (and may be optimized) for low current consumption mode of the MOSFET M1. The low power charge pump 103 may be dimensioned such that the charge at the gate of the MOSFET M1 can be maintained.

As an option, the comparator unit may also be arranged such that it monitors a voltage Vds across the drain and the source of the MOSFET M1 (not shown in FIG. 1).

In case the voltage across the MOSFET M1 drops below a predefined value, the comparator unit 102 is able to detect the IDLE state and the logic unit 105 may indicate to all attached components to reduce current consumption. Hence, the low power charge pump 103 may be activated and the high power charge pump 104 may be deactivated. The high power charge pump 104 may be used to re-enter the ON state from the IDLE state of the electronic switch MOSFET M1.

Hence, the following states (which may also be considered as modes) of the electronic switch may be selected:

(S1) the electronic switch being switched off: OFF state;
(S2) the electronic switch being switched on, normal operation (mode) of the device: ON state;
(S3) the electronic switch being switched on with reduced current consumption (also of the control elements supplying the electronic switch), standby mode of the device: IDLE state.

The additional state (S3) bears the advantage that the electronic switch in addition to it being switched off (S1) or switched ON (S2) of a low power mode that supplies the electronic switch with a reduced amount of electrical power to maintain its conductive state and with the features that the switch could still be switched off to state (S1) and
that it may provide additional features, e.g., conduct predefined actions and may therefore (automatically and) temporarily re-enter the state (S2).

The state (S3) may be automatically activated as soon as the comparator unit 102 detects via the voltage Vgs that the electronic switch MOSFET M1 is switched on. A signal applied to the input pin 109 of the logic unit 105 may indicate that the device is in a standby state or in normal operation. Hence, the states (S2) or (S3) may be entered depending on the actual signal applied to the input pin 109 in view of the voltage Vgs detected by the comparator unit 102. For example, the signal at the input pin 109 and the signal provided by the comparator unit 102 can be combined via an AND gate to determine whether the state (S2) or the state (S3) is to be entered.

It is noted that the logic unit 105 may have several input pins that may be used for various applications which allows the user to configure the states (S1) to (S3) of the switch flexibly dependent on external signals that may be available in the device, e.g., the car.

As an example, the electronic switch may comprise a current-sense functionality. In the state (S2) the current-sense feature is activated, the current consumed by the electronic switch may amount to several milliamperes. In the state (S3), the current-sense feature may be deactivated in order to further reduce the current consumption. The decision whether or not to activate the current-sense feature may be made by the logic unit 105 based on a signal applied via one of its input pins. However, instead of a huge number of input pins, the logic unit 105 may comprise a decoder that is able to decode various patterns ("command"), e.g., sequence of bits, to determine which decision to make. Based on the (number of) input pins and/or such patterns, the user has a high degree of flexibility to utilized the various functionalities of the electronic switch and the components driving the electronic switch, in particular with regard to low energy modes.

For example, even if the device (e.g., car) is in a standby state, a state change from the state (S3) in the state (S2) of the electronic switch can be conducted in order to perform a predefined action or operation by the circuitry driving the electronic switch and/or by the electronic switch itself. For example, the following steps that involves the electronic switch may be performed while the device is in its standby state: a change from state (S3) to state (S2), a current-sensing operation by the or utilizing the electronic switch, a change back from state (S2) to state (S3). Such state changes may result in only a slight increase of the overall current consumption, which may be acceptable for many scenarios. Also, the frequency of such state changes could be adjusted on demand, in particular in view of the respective application and/or based on safety requirements.

Figure 2:
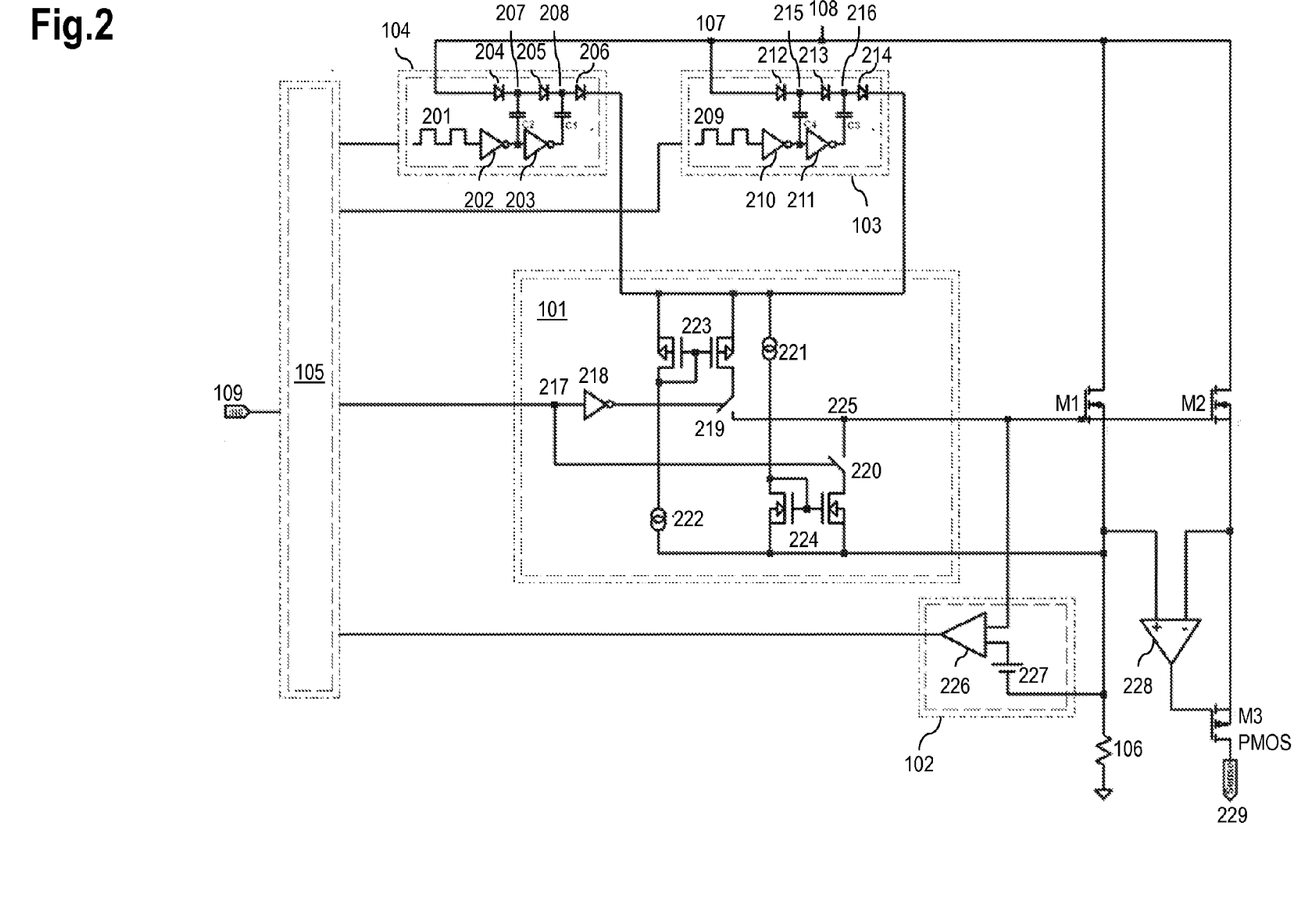
FIG. 2 shows a more detailed diagram based on the block structure shown in FIG. 1.

FIG. 2 shows a more detailed diagram based on the block structure shown in FIG. 1.

The high power charge pump 104 shows an oscillator signal 201 that is fed to an inverter 202. The output of the inverter 202 is connected via a capacitor C2 to a node 207 and via a series connection comprising an inverter 203 and a capacitor C1 to a node 208. The node 107 is connected via a diode 204 to the node 207 and the node 207 is connected via a diode 205 to the node 208. The node 208 is connected via a diode 206 to the gate driver 101. All diodes 204, 205 and 206 are arranged such that their cathode points towards the gate driver 101.

The low power charge pump 103 shows an oscillator signal 209 that is fed to an inverter 210. The output of the inverter 210 is connected via a capacitor C4 to a node 215 and via a series connection comprising an inverter 211 and a capacitor C3 to a node 216. The node 107 is connected via a diode 212 to the node 215 and the node 215 is connected via a diode 213 to the node 216. The node 216 is connected via a diode 214 to the gate driver 101. All diodes 212, 213 and 214 are arranged such that their cathode points towards the gate driver 101.

The gate driver 101 comprises two current mirrors 223, 224 and two current sources 221, 222. The logic unit 105 controls the gate driver 101: a signal applied to a node 217 activates either a switch 220 (if the signal supplied by the logic unit 105 is high) or—via an inverter 218—the switch 219 (if the signal supplied by the logic unit 105 is low). If the switch 220 is activated, the current of the current source 221 is mirrored to a node 225 and thus used to control the gate of the MOSFET M1. If the switch 219 is activated, the current of the current source 222 is mirrored to the gate of the MOSFET M1. Hence, the logic unit 105 may indicate to the gate driver to actively charge or discharge the gate of the MOSFET M1. In the state (S3) the charge of the gate of the MOSFET M1 is maintained via the low power charge pump 103.

The comparator unit 102 comprises a comparator 226 and a reference voltage 227, wherein the first input of the comparator 226 is connected to the gate of the MOSFET M1 and the second input of the comparator 226 is connected via the reference voltage 227 to the source of the MOSFET M1. The output of the comparator 226 is connected to the logic unit 105. The reference voltage 227 allows adjusting an offset of the signals to be compared.

The node 107 is also connected to the drain of a MOSFET M2 and the node 225 is connected to the gate of the MOSFET M2. The source of the MOSFET M1 is connected to the non-inverting input of an operational amplifier 228 and the source of the MOSFET M2 is connected to the inverting input of the operational amplifier 228. The output of the operational amplifier 228 is connected to the gate of a MOSFET M3. The source of the MOSFET M3 is connected to the source of the MOSFET M2. The drain of the MOSFET M3 provides a sense current 229, which may be processed by an external device or it may be fed to the logic unit 105 for further processing.

The MOSFETs M1 and M2 are NMOS and the MOSFET M3 is a PMOS device. The MOSFET M1 is a power transistor, the MOSFET M2 is a sense transistor and the MOSFET M3 supplies a sense current as follows: at the non-inverting input of the operational amplifier 228 a reference voltage is supplied, wherein the operational amplifier 228 is controlled such that both its inputs are equal. Hence, the MOSFET M3 supplies a sense current 229 that is proportional to the current that flows through the MOSFET M1, but substantially smaller. For example, the sense current 229 may be in the order of 1:10000 of the current flowing through the power transistor MOSFET M1.

This is one example as how the current through the MOSFET M1 can be determined, e.g., by the logic unit 105. Based on such current, the third state (S3) may be initiated if the current sensed falls below a predetermined value (which corresponds, e.g., to a current through the MOSFET M1 amounting to 1 A) and the second state (S2) may be initiated if this current indicates a current through the MOSFET M1 amounting to more than this predetermined value.

Hence, the solution presented in particular allows providing a third state (S3) of the electronic switch. This third state (S3) provides a reduced power consumption of the electronic switch and its associated components, in particular for those components that are provided in order to control the electronic switch.

Various kinds of charge pump(s) could be realized, for example two charge pumps as indicated above, e.g., a high power charge pump 104 and a low power charge pump 103. As an alternative, a single charge (e.g., high power) pump could be used. It is also an option that the single charge pump may comprise two charge-pump functionalities (of the low and high charge pumps) as described above to provide enabling the low power mode of the electronic switch as well as its associated components (e.g., driver, comparator, etc.).

In addition or as an alternative, the (at least one) charge pump may be driven by a clock to provide different charges with altering clock cycles, e.g., clock cycles of different timing pattern and/or delay pattern, to the gate of the electronic switch.

As an option, the state (S3) may operate without additional monitoring or safety functions. It is also an option that the state (S3) also utilizes such additional monitoring and/or safety functions. In case some safety functionality is required also for the state (S3), in order to safeguard the line connected to the electronic switch as well as the electronic switch itself, the state (S3) may provide the following features:
  overtemperature protection;
  thermal shutdown in case of overtemperature (via a latch or a restart);
  overcurrent protection;
  shutdown due to overcurrent (via a latch or a restart);
  shutdown due to a short-circuit.

The temperature and/or current values that trigger overtemperature and/or overcurrent protection may be the same values or may be different values as used in the state (S2).

As another option, the electronic switch may comprise an error flag (with its state stored in, e.g., a latch). The error flag may be set when the electronic switch enters the state (S1) from the state (S3), i.e. switches off based on, e.g., one of the errors (overcurrent, overtemperature) as indicated above. Hence, the error flag may be used to indicate to a controller that the electronic switch is no longer conductive. Preferably, the current consumed in such scenario, i.e. the error flag being set, electronic switch in state (S1), may be low. However, depending on the type of error, the current consumption, e.g., due to a priority of this error, may be higher than in the state (S3).

It is noted that the electronic switch may be an n-channel-MOSFET or a p-channel-MOSFET. It is also an option to provide a low side n-channel-MOSFET. In such cases, the charge pump(s) can be omitted.

Figure 3:
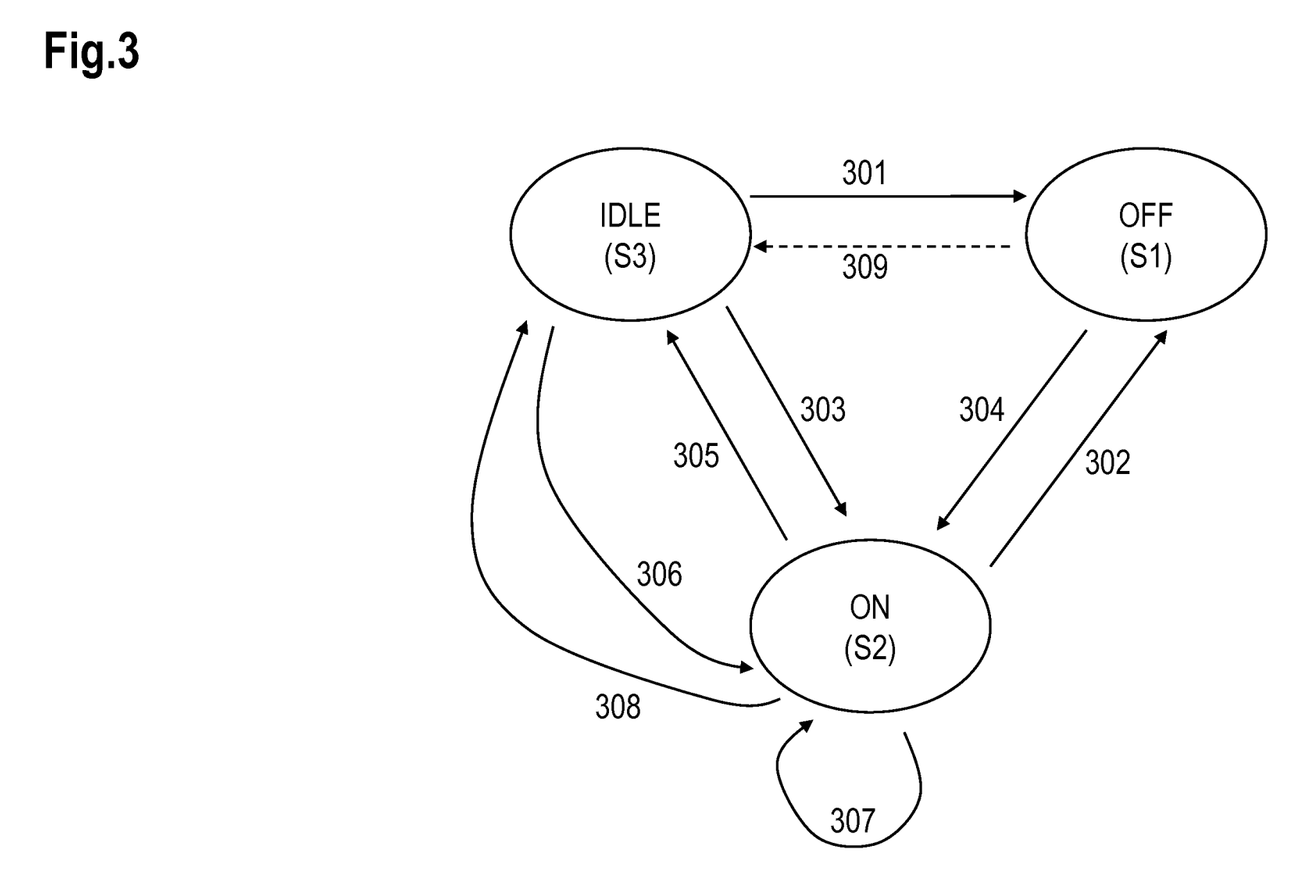
FIG. 3 shows an exemplary state transition diagram for the three states "ON state", "IDLE state" and "OFF state" of an electronic switch.

FIG. 3 shows an exemplary state transition diagram comprising the states (S1), (S2) and (S3), wherein an error (e.g., high temperature, high current, external signal indicating an error to the logic unit) may be the reason for a transition 301 from the state (S3) to the state (S1) or for a transition 302 from the state (S2) to the state (S1) thereby deactivating the electronic switch.

If the device, e.g., vehicle is activated (e.g. enters the driving mode), the electronic switch is activated to the state (S2) either from the state (S3)—see transition 303—or from the state (S1)—see transition 304.

In case the device enters the low power mode (e.g., the car being parked), the state of the electronic switch changes from the state (S2) to the state (S3)—see transition 305.

When in the state (S3), based on a trigger (internal or external), the electronic switch may experience a transition 306 from the state (S3) to the state (S2), then a predefined action is performed (indicated by transition 307, which remains in the state (S2)) and returns via transition 308 to the state (S3).

It is also feasible that the switch enters the state (S3) directly from the state (S1), which is indicated by a transition 309. If the charge at the isolated gate of the electronic switch does not suffice, in a subsequent step the transitions 306 to 308 may be conducted in order to re-charge the isolated gate to a predefined level.

Figure 4:
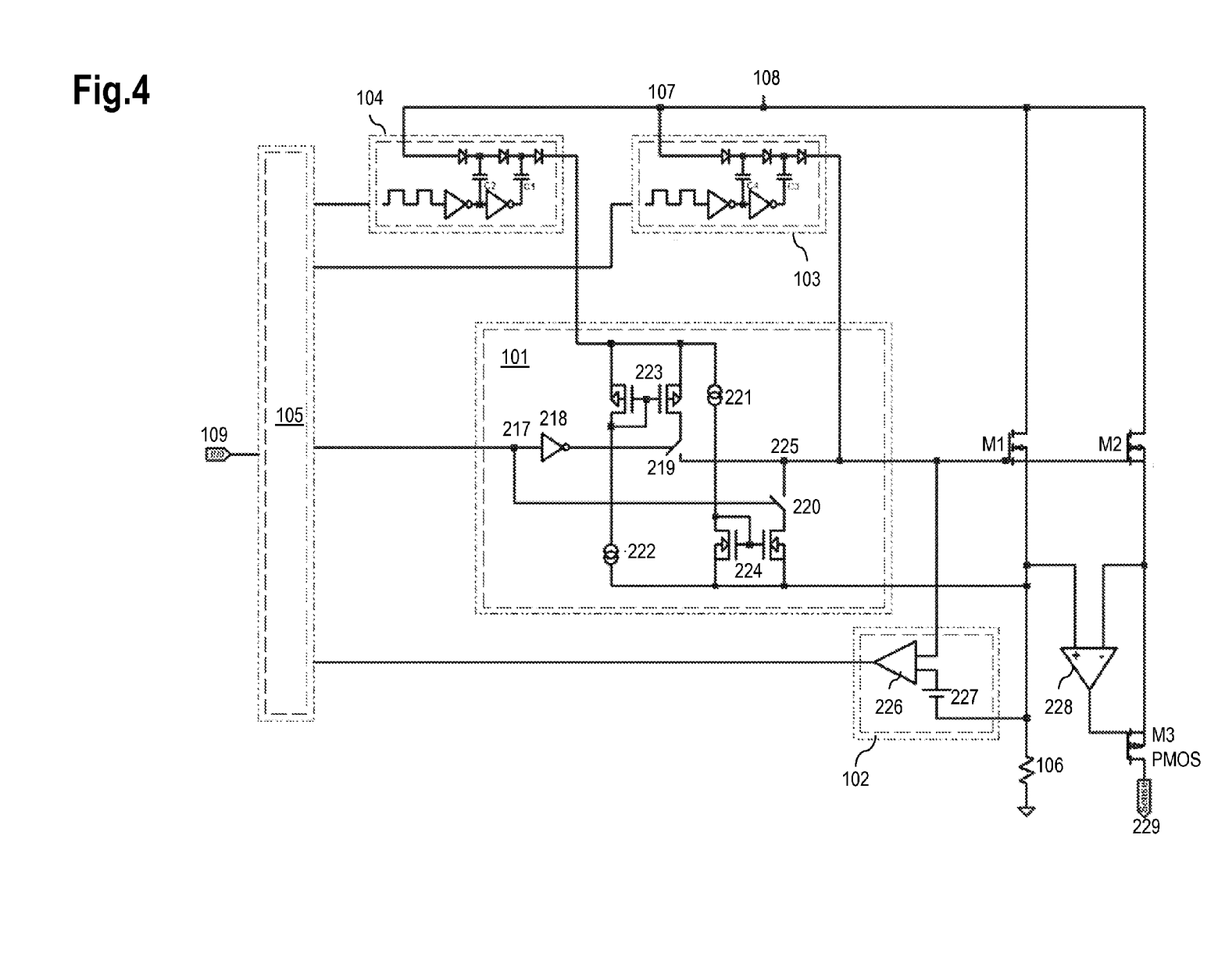
FIG. 4 shows an alternative embodiment to the block diagram of FIG. 2.

FIG. 4 shows an alternative embodiment to the block diagram of FIG. 2. In contrast to FIG. 2, the output of the low power charge pump 103 is connected to the node 225, which is an alternative for the low power charge pump 103 to supply load to the gate of the MOSFET M1.

Figure 5:
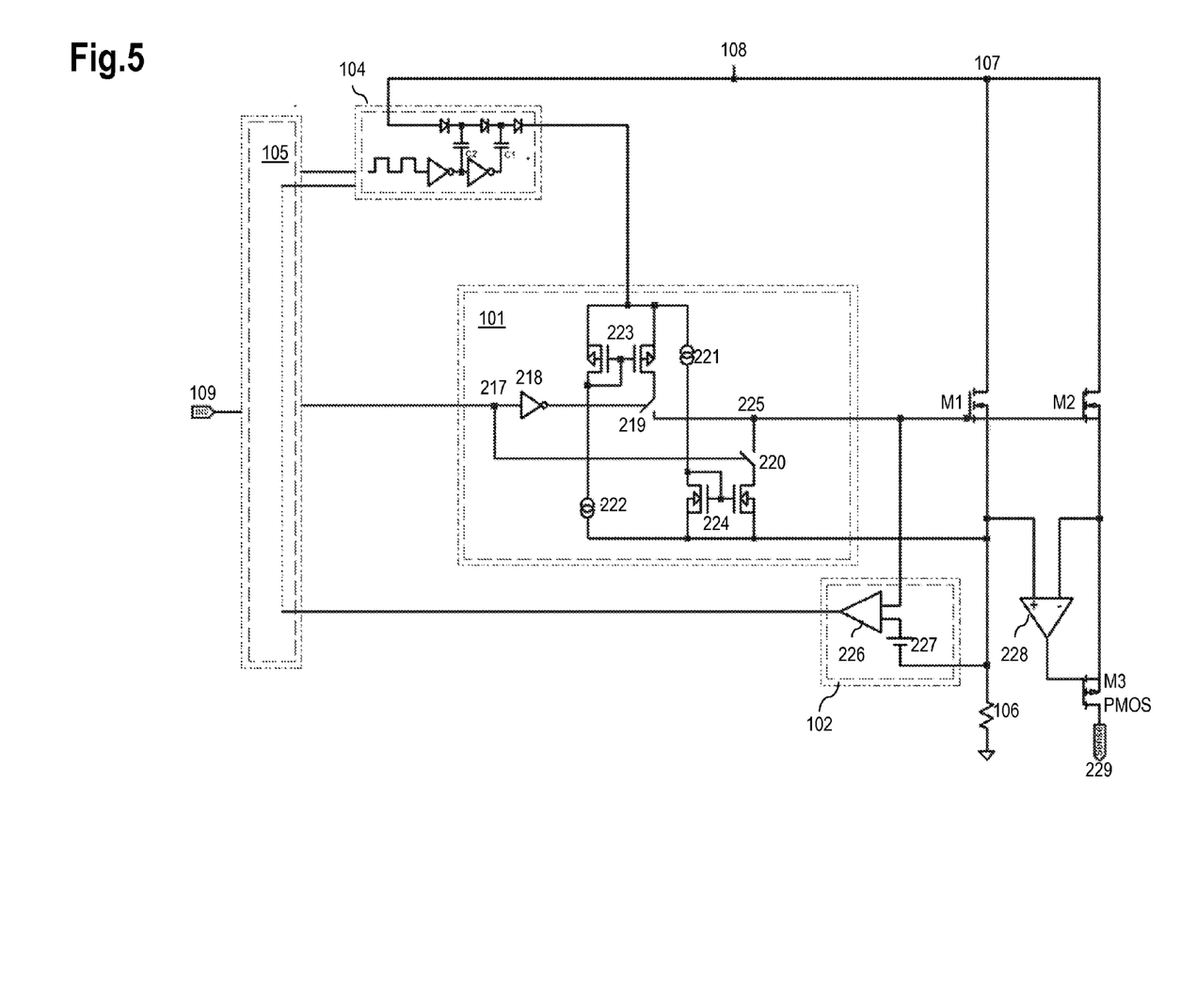
FIG. 5 shows another alternative embodiment based on FIG. 2 comprising only a high power charge pump.

FIG. 5 shows another alternative embodiment based on FIG. 2 without the low power charge pump 103. The comparator unit 102 may indicate to the logic unit 105 during the state (S3) in case an insufficient load is detected at the gate of the MOSFET M1. The logic unit 105 can then trigger the high power charge pump to supply load to the gate of the MOSFET M1.

Figure 6:
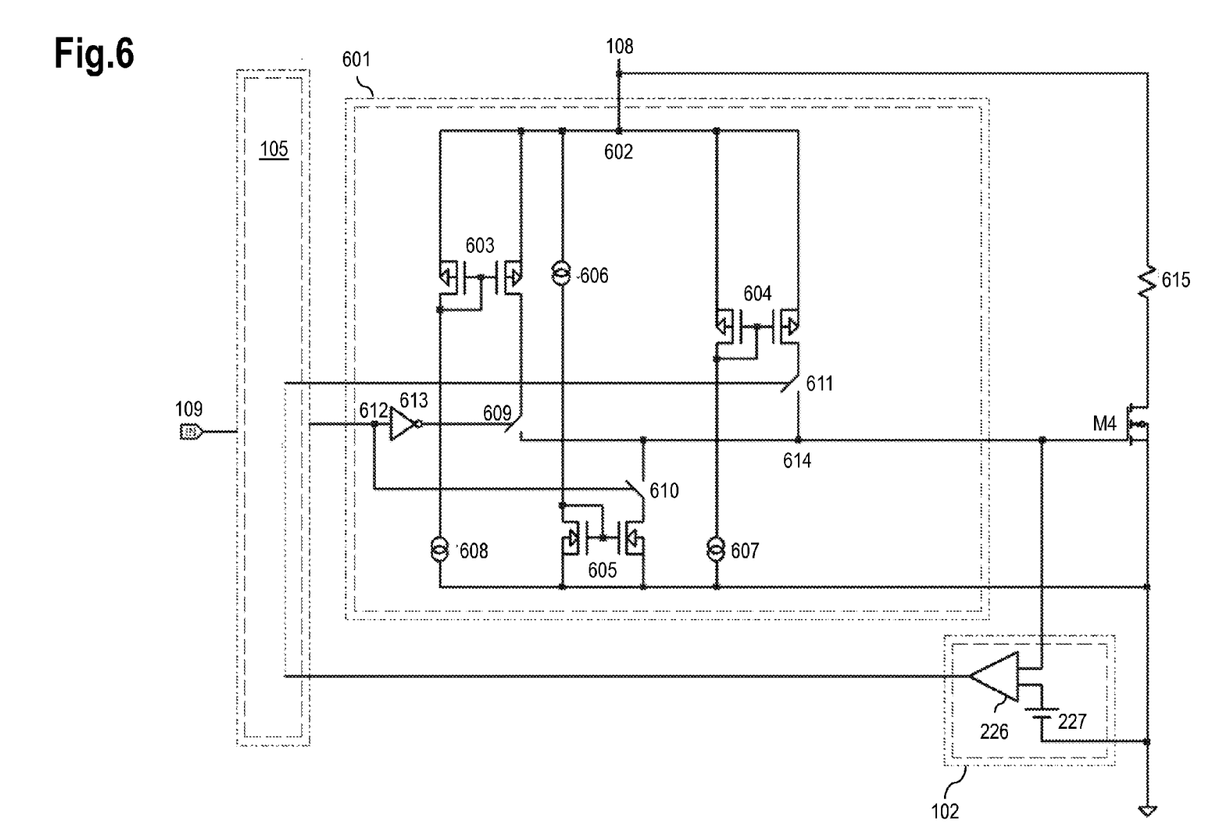
FIG. 6 shows an exemplary circuitry using several current sources to supply a high current path and a low current path for an NMOS device used as a power transistor.

FIG. 6 shows an exemplary circuitry using several current sources to drive a MOSFET M4 as a power transistor. The MOSFET M4 is a NMOS. A gate driver 601 is connected to the supply voltage 108 via a node 602. Also the supply voltage is connected via a resistor 615 to the drain of the MOSFET M4. The source of the MOSFET M4 is connected to ground. The comparator unit 102 corresponds to the comparator unit of FIG. 2. Also the logic unit 105 corresponds to the logic unit of FIG. 2.

The gate driver 601 comprises three current mirrors 603 to 605 and three current sources 606 to 608. The logic unit 105 controls the gate driver 601: a signal applied to a node 612 activates either a switch 610 or—via an inverter 613—a switch 609. If the switch 610 is activated, the current of the current source 606 is mirrored to a node 614 and thus used to control the gate of the MOSFET M4. If the switch 609 is activated, the current of the current source 608 is mirrored to control the gate of the MOSFET M4. Hence, the logic unit 105 may indicate to the gate driver 601 to actively charge or discharge the gate of the MOSFET M4. This allows entering the state (S2) or switching the MOSFET M4 off (i.e. entering the state (S1)).

A switch 611 can be activated during the state (S3) to supply the current of the current source 607 via the current mirror 604 to the gate of the MOSFET M4. The comparator unit 102 may indicate to the logic unit 105 during the state (S3) in case an insufficient load is detected at the gate of the MOSFET M4. The logic unit 105 can then trigger the switch 611 to supply load to the gate of the MOSFET M4.

In FIG. 6 the energy supply comprises a high current path supplied by the current sources 606 and 608 to actively switch the MOSFET M4 either on or off and a low current path supplied by the current source 607 used for maintaining a predetermined amount of load at the gate of the MOSFET M4.

Figure 7:
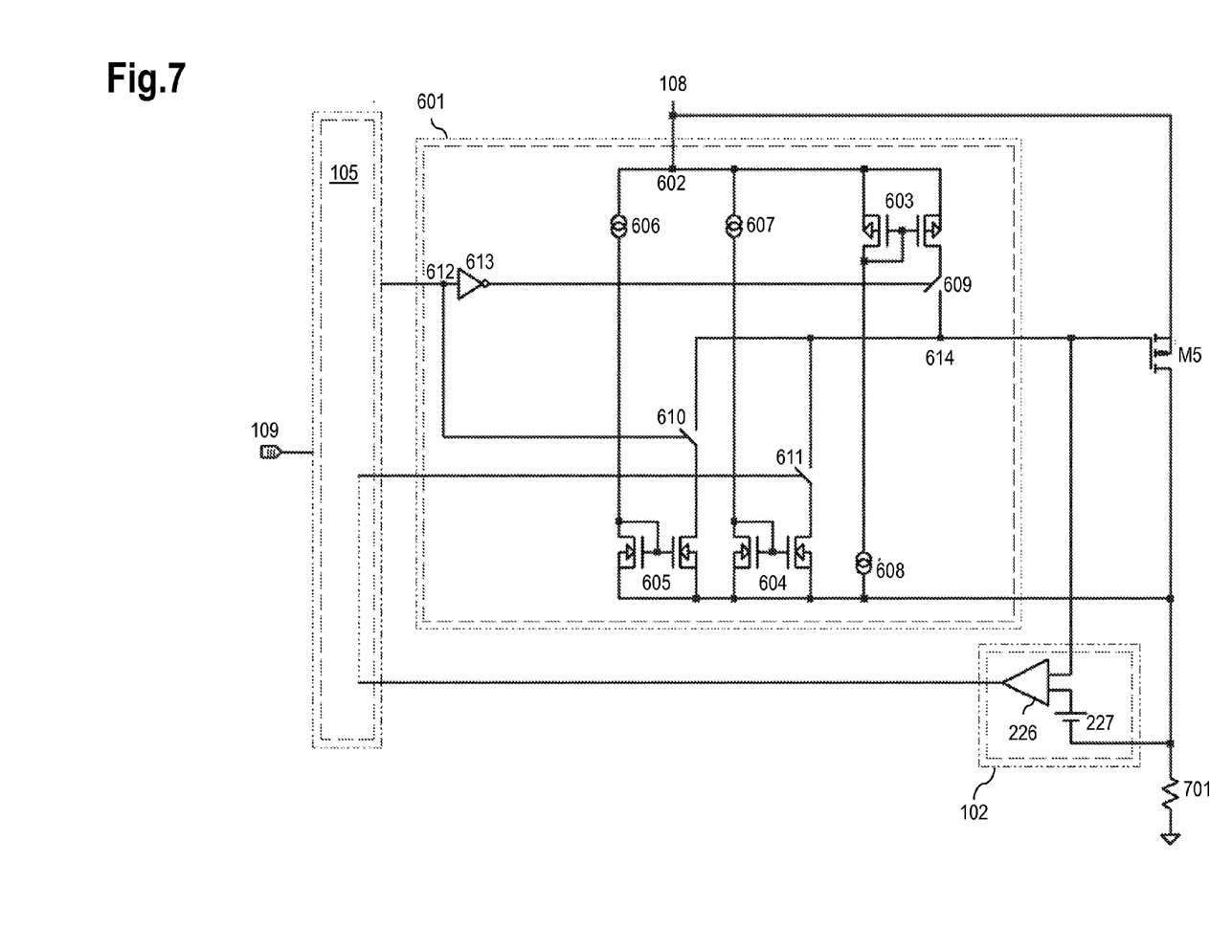
FIG. 7 shows an exemplary circuitry using several current sources to supply a high current path and a low current path for a PMOS device used as a power transistor.

FIG. 7 shows an alternative implementation of the gate driver based on FIG. 6, wherein a MOSFET M5 is a PMOS in contrast to the NMOS shown in FIG. 6. Hence, the supply power 108 is connected to the source of the MOSFET M5 and the drain of the MOSFET M5 is connected via a resistor 701 to ground. The explanations in particular referring to the gate driver 601, the logic unit 105 and the comparator unit 102 provided with regard to FIG. 6 apply accordingly.

At least one of the following examples and/or embodiments may be considered innovative. They might be combined with other aspects or embodiments as described. Any embodiment or design described herein is not necessarily to be construed as preferred or advantageous over other embodiments or designs.

A circuitry is suggested, comprising
an electronic switch with an isolated gate;
a measuring device for determining a charge at the isolated gate;
an energy supply for providing charge to the isolated gate based on the charge determined by the measuring device.

The measuring device may determine the absolute or relative amount of charge at the gate of the electronic switch and/or a variation or change of such charge. The measuring device may in particular determine a voltage at the isolated gate of the electronic switch, e.g., a voltage across the isolated gate and the source/emitter or the gate and the drain/collector of the electronic device. The measuring device may also determine a voltage across the drain/collector and the source/emitter of the electronic device. The voltage (charge) determined may thus be used to control the energy (charge) provided by the energy supply to the isolated gate of the electronic switch.

Hence, the circuitry suggested herein provides a functionality of a (controlled) fuse that could be used in combination with any device which may utilize such fuse. The device may in particular be a vehicle, e.g., a car. Accordingly, the device can be a portion of such vehicle, e.g., a control unit of the vehicle. Hence several such circuitries can be used for one device.

In an embodiment, the energy supply is arranged to either supply a high amount of charge or a low amount of charge to the isolated gate of the electronic switch.

In an embodiment, the energy supply comprises at least one of the following:
  a single charge pump;
  a single charge pump with a low power mode and a high power mode;
  a low power charge pump and a high power charge pump;
  more than two charge pumps with at least two of these charge pumps having different power;
  at least one current source and a current mirror;
  a high current path and a low current path, wherein the high current path comprises at least one high current source and the low current path comprises at least one low current source.

In an embodiment, the circuitry comprises a driver that is coupled between the energy supply and the isolated gate.

In an embodiment, the circuitry comprises a logic unit for directly or indirectly controlling the energy supply and the electronic switch, wherein the measuring device is connected to the logic unit to supply the charge determined or an information of the charge determined to the logic unit.

The logic unit may be any sort of control device, e.g., a microcontroller, a controller, a processor or the like. The logic unit may be part of the device the electronic switch is utilized in. For example, the logic unit may be part of a control unit of a vehicle or it may have an interface to at least one such control unit.

In an embodiment, the energy supply comprises a low power charge pump and wherein the logic unit is arranged to select the low power charge pump at least partially during an IDLE state.

In an embodiment, the IDLE state is entered if a device to which the circuitry is connected enters a low power mode.

Hence, the device, e.g., vehicle, may enter a parking state in which the current consumption should be reduced, in particular minimized, in order to consume as little battery power as possible. Hence, such low power mode of the device may be distinguished from a normal mode in which the generator of the vehicle is active and the current consumption of the circuitry, in particular the electronic switch, may be increased. In both states, the IDLE state and the ON state, the electronic switch is conductive, in the IDLE state the current consumed by the circuitry may be in the range of several microamperes, whereas in the ON state the current consumed may be in the range of several milliamperes. However, these are only exemplary values to illustrate one feature of the circuitry. Accordingly, applications for other devices as well as other current consumptions are feasible.

For example, if the device enters the low power mode from normal operation, a control unit of the device may indicate this to the logic unit, which may then initiate the transition from the ON state to the IDLE state.

In an embodiment, the electronic switch is temporarily re-activated from the IDLE state if the charge at the isolated gate drops below a predefined threshold.

In an embodiment, a high power charge pump is provided that supplies charge to the isolated gate, wherein the logic unit is arranged to activate the high power charge pump in case the charge at the isolated gate drops below a predefined threshold.

In an embodiment, the circuitry re-enters the IDLE state if the charge at the isolated gate has been restored.

In an embodiment, the logic unit is arranged to
based on a trigger, re-activate the electronic switch from the IDLE state by supplying its isolated gate with a higher amount of charge compared to the charge provided during the idle mode,
perform a predefined action and
re-activate the IDLE state.

In an embodiment, the trigger is at least one of the following:
an external signal applied to the logic unit;
a detection of a failure;
a detection of a temperature exceeding a predetermined threshold;
a detection of a current exceeding a predetermined threshold;
a trigger provided by a timer or a clock.

In an embodiment, the predefined action comprises at least one of the following:
a current sensing;
a temperature sensing;
issuing a notification;
a re-charging of the isolated gate.

Various actions could be performed during the electronic switch being temporarily re-activated (in the ON state). This provides additional flexibility, as the circuitry allows conducting various such actions during low power mode of the device (e.g., the vehicle being in parking state), whereas the frequency of these actions can be adjusted based on the overall available electrical power. The actions could also be prioritized based on, e.g., an urgency (a failure or an alarm) and/or based on the electrical power level that is still available.

A notification in this regard may be any information stored and/or conveyed to a memory or any addressee. Examples of notifications are: a failure message, a failure bit (flag), an alarm, etc.

In an embodiment, the circuitry comprises a measuring unit to determine at least one of the following triggers:
a temperature exceeding a predetermined threshold;
a current exceeding a predetermined threshold;
a timer.

The measuring unit may be part of the measuring device. It may also be integrated into one of the components of the circuitry or provided as at least on additional component.

For example, the measuring unit could be a current sensing feature supplied by the electronic switch.

In an embodiment, the energy supply comprises a high power charge pump and wherein the logic unit is arranged to select the high power charge pump at least partially during an ON state.

In an embodiment, the ON state is entered if a device to which the circuitry is connected enters a normal operation mode.

The normal operation mode may be any mode of the device that is different from the device being fully switched off (e.g., during maintenance) or in the low power mode described above. For example, a car as an exemplary device may be in normal operation mode when being driven, during its generator being active, in a charging state recharging its battery or the like.

In an embodiment, the logic unit is arranged to switch the electronic switch to an OFF state in case a short-circuit is detected or in case of a predefined signal is applied to the logic unit.

In its OFF state the electronic switch interrupts the current to (or from) the device. This state corresponds to a fuse being activated. Entering the OFF state can have several reasons, e.g.: detection of a short-circuit, overtemperature, overcurrent, etc. It can also be based on an external signal supplied to the control unit by the device, e.g., a control unit of a vehicle.

In an embodiment, the measuring device comprises a comparator unit, wherein the inputs of the comparator unit are connected to the electronic switch to determine a voltage across to terminals of the electronic switch.

For example, a first input of the comparator unit may be coupled to the isolated gate of the electronic switch and a second input of the comparator unit may be coupled to the source of the electronic switch. As an option, the first input may be coupled to the source and the second input may be coupled to the drain of the electronic switch.

In an embodiment, the electronic switch is arranged to be operated in either one of the following states:
an ON state, in which a high amount of charge is supplied via the energy supply to the isolated gate;
an IDLE state in which a low amount of charge is supplied via the energy supply to the isolated gate;
an OFF state in which the electronic switch is switched off.

The ON state and the IDLE state are both conductive modes of the electronic switch. The IDLE state allows the electronic switch being in the conductive mode, but to consume a reduced amount of power compared to the ON state. The high amount of charge is higher than the low amount of charge. The high amount of charge can be supplied by a high power charge pump and the low amount of charge can be supplied by a low power charge pump. During low power mode of the device, the circuitry may utilize the low amount of charge to keep the electronic switch in conductive mode (utilizing its IDLE state).

In an embodiment, the circuitry comprises a memory for storing at least one state of the electronic switch.

Such memory may be realized as a flag, a register or a latch. The memory may store at least one previous state of the electronic switch. The memory may be a flag indicating that the electronic switch entered the OFF state from the IDLE state. This allows the logic unit to determine that an error occurred (e.g., temperature and/or current exceeding a predetermined threshold).

In an embodiment, the electronic switch comprises at least one of the following:

a transistor,
a PMOSs,
an NMOS,
a FET,
a JFET,
an IGBT.

The isolated gate of the electronic switch may serve as a control input.

In an embodiment, the electronic switch is a n-channel high side switch.

A vehicle is suggested comprising at least one circuitry as described herein.

Also, a method is suggested for controlling an electronic switch with an isolated gate, comprising the steps:
  determining a charge at the isolated gate;
  providing charge to the isolated gate based on the charge determined.

In an embodiment, the electronic switch is operated in either one of the following states:
  an ON state, in which a high amount of charge is supplied via the energy supply to the isolated gate;
  an IDLE state in which a low amount of charge is supplied via the energy supply to the isolated gate;
  an OFF state in which the electronic switch is switched off.

In an embodiment,
  the IDLE state is entered if a device to which the circuitry is connected enters a low power mode;
  the ON state is entered if a device to which the circuitry is connected enters a normal operation mode.

In an embodiment,
  the electronic switch is re-activated from the IDLE state to the ON state if the charge at the isolated gate drops below a predefined threshold;
  the charge at the isolated gate is increased;
  the IDLE state is re-entered.

In an embodiment,
  based on a trigger, a state transition from the IDLE state to the ON state is conducted,
  a predefined action is performed;
  the IDLE state is re-activated.

In an embodiment, the trigger is at least one of the following:
  an external signal applied to the logic unit;
  a detection of a failure;
  a detection of a temperature exceeding a predetermined threshold;
  a detection of a current exceeding a predetermined threshold;
  a trigger provided by a timer or a clock.

In an embodiment, the predefined action is at least one of the following:
  a current sensing;
  a temperature sensing;
  issuing a notification;
  a re-charging of the isolated gate.

In an embodiment, the electronic switch enters the OFF state in case a short-circuit is detected or in case a predefined signal.

The predefined signal may be an external signal provided by a device, e.g., a control unit of a car.

An electronic switching circuitry is suggested comprising:
  means for determining a charge at the isolated gate;
  means for providing charge to the isolated gate based on the charge determined.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A circuitry, comprising
an electronic switch with an isolated gate;
a measuring device for determining a charge at the isolated gate;
an energy supply for providing charge to the isolated gate when the determined charge at the isolated gate drops below a predefined threshold; and
a logic unit for directly or indirectly controlling the energy supply and the electronic switch, wherein the measuring device is connected to the logic unit to supply the charge determined or an information of the charge determined to the logic unit, wherein
  the energy supply comprises a low power charge pump and wherein the logic unit is arranged to select the low power charge pump at least partially during an IDLE state;
  the electronic switch is temporarily reactivated from the IDLE state if the charge at the isolated gate drops below a predefined threshold,
  a high power charge pump is provided that supplies charge to the isolated gate, and
  the logic unit is arranged to activate the high power charge pump in case the charge at the isolated gate drops below the predefined threshold.

2. The circuitry according to claim 1, wherein the energy supply is arranged to either supply a high amount of charge or a low amount of charge to the isolated gate of the electronic switch.

3. The circuitry according to claim 1, wherein the energy supply comprises at least one of the following:
  a single charge pump;
  a single charge pump with a low power mode and a high power mode;
  a low power charge pump and a high power charge pump;
  more than two charge pumps with at least two of the more than two charge pumps having different power;
  at least one current source and a current mirror; and
  a high current path and a low current path, wherein the high current path comprises at least one high current source and the low current path comprises at least one low current source.

4. The circuitry according to claim 1, comprising a driver that is coupled between the energy supply and the isolated gate.

5. The circuitry according to claim 1, wherein the IDLE state is entered if a device to which the circuitry is connected enters a low power mode.

6. The circuitry according to claim 1, wherein the circuitry re-enters the IDLE state if the charge at the isolated gate has been restored.

7. The circuitry according to claim 1, wherein the logic unit is arranged to, based on a trigger, reactivate the electronic switch from the IDLE state by supplying the isolated gate with a higher amount of charge compared to the charge provided during the IDLE state,
perform a predefined action, and
reactivate the IDLE state.

8. The circuitry according to claim 7, wherein the trigger is at least one of the following:
an external signal applied to the logic unit;
a detection of a failure;
a detection of a temperature exceeding a predetermined threshold;
a detection of a current exceeding a predetermined threshold; and
a trigger provided by a timer or a clock.

9. The circuitry according to claim 7, wherein the predefined action comprises at least one of the following:
a current sensing;
a temperature sensing;
issuing a notification; and
a recharging of the isolated gate.

10. The circuitry according to claim 7, comprising a measuring unit to determine at least one of the following triggers:
a temperature exceeding a predetermined threshold;
a current exceeding a predetermined threshold; and
a timer.

11. The circuitry according to claim 1, wherein the logic unit is arranged to select the high power charge pump at least partially during an ON state.

12. The circuitry according to claim 11, wherein the ON state is entered if a device to which the circuitry is connected enters a normal operation mode.

13. The circuitry according to claim 1, wherein the logic unit is arranged to switch the electronic switch to an OFF state in case a short-circuit is detected or in case of a predefined signal is applied to the logic unit.

14. The circuitry according to claim 1, wherein the measuring device comprises a comparator unit, wherein inputs of the comparator unit are connected to the electronic switch to determine a voltage across two terminals of the electronic switch.

15. The circuitry according to claim 1, wherein the electronic switch is arranged to be operated in one of the following states:
an ON state, in which a high amount of charge is supplied via the energy supply to the isolated gate;
an IDLE state in which a low amount of charge is supplied via the energy supply to the isolated gate; and
an OFF state in which the electronic switch is switched off.

16. The circuitry according to claim 1, comprising a memory for storing at least one state of the electronic switch.

17. The circuitry according to claim 1, wherein the electronic switch comprises at least one of the following:
a transistor,
a PMOS,
an NMOS,
a FET,
a JFET,
an IGBT.

18. The circuitry according to claim 1, wherein the electronic switch is a re-channel high side switch.

19. A vehicle comprising at least one circuitry according to claim 1.

20. The circuitry according to claim 1, wherein an ON state is entered if a device to which the circuitry is connected enters a high power mode.

21. A method for controlling an electronic switch with an isolated gate, comprising:
determining, by a measuring device, a charge at the isolated gate;
providing charge, by an energy supply, to the isolated gate when the determined charge at the isolated gate drops below a predefined threshold, wherein the energy supply comprises a low power charge pump;
selecting, by a logic unit, the low power charge pump at least partially during an IDLE state, wherein the measuring device is connected to the logic unit;
directly or indirectly controlling the energy supply and the electronic switch by the logic unit;
supplying, by the measuring device, the charge determined or an information of the charge determined to the logic unit;
is temporarily reactivating the electronic switch the IDLE state if the charge at the isolated gate drops below a predefined threshold; and
activating, by the logic unit, by a high power charge pump of the energy supply, in case the charge at the isolated gate drops below the predefined threshold, wherein the high power charge pump supplies the charge to the isolated gate.

22. The method according to claim 21, wherein the electronic switch is operated in one of the following states:
an ON state, in which a high amount of charge is supplied via the energy supply to the isolated gate;
the IDLE state in which a low amount of charge is supplied via the energy supply to the isolated gate; and
an OFF state in which the electronic switch is switched off.

23. The method according to claim 22, wherein
the IDLE state is entered if a device to which the energy supply is connected enters a low power mode; and
the ON state is entered if a device to which the energy supply is connected enters a normal operation mode.

24. The method according to claim 22, wherein the electronic switch is reactivated from the IDLE state to the ON state if the charge at the isolated gate drops below the predefined threshold;
the charge at the isolated gate is increased; and
the IDLE state is re-entered.

25. The method according to claim 22, wherein
based on a trigger, a state transition from the IDLE state to the ON state is conducted,
a predefined action is performed; and
the IDLE state is reactivated.

26. The method according to claim 25, wherein the trigger is at least one of the following:
an external signal applied to the logic unit;
a detection of a failure;
a detection of a temperature exceeding a predetermined threshold;
a detection of a current exceeding a predetermined threshold; and
a trigger provided by a timer or a clock.

27. The method according to claim 25, wherein the predefined action is at least one of the following:
a current sensing;
a temperature sensing;
issuing a notification; and
a recharging of the isolated gate.

28. The method according to claim 22, wherein the electronic switch enters the OFF state in case a short-circuit is detected or in case a predefined signal is detected.

29. An electronic switching circuitry, comprising:
- means for determining a charge at an isolated gate of an electronic switch;
- means for providing charge to the isolated gate when the determined charge at the isolated gate drops below a predefined threshold; and
- a logic unit means for directly or indirectly controlling the means for providing charge and the electronic switch, wherein the means for determining the charge is connected to the logic unit means to supply the charge determined or an information of the charge determined to the logic unit means, wherein
- the means for providing charge comprises a low power charge pump and wherein the logic unit means is arranged to select the low power charge pump at least partially during an IDLE state;
- the electronic switch is temporarily reactivated from the IDLE state if the charge at the isolated gate drops below a predefined threshold,
- a high power charge pump is provided that supplies charge to the isolated gate, and
- the logic unit means is arranged to activate the high power charge pump in case the charge at the isolated gate drops below the predefined threshold.

* * * * *